United States Patent [19]

Pellant et al.

[11] 4,037,246

[45] July 19, 1977

[54] HIGH-POWER SEMICONDUCTIVE DEVICES

[75] Inventors: Michal Pellant; Oldrich Pokorny; Pavel Reichel; Jaroslav Zuna; Pavel Kafunek; Jindrich Kratina, all of Prague, Czechoslovakia

[73] Assignee: CKD Praha, oborovy podnik, Prague, Czechoslovakia

[21] Appl. No.: 596,437

[22] Filed: July 16, 1975

[30] Foreign Application Priority Data

Sept. 5, 1974 Czechoslovakia .................. 6116/74

[51] Int. Cl.² .................. H01L 23/48; H01L 23/02; H01L 25/04
[52] U.S. Cl. ........................................ 357/82; 357/66; 357/74
[58] Field of Search ............................. 357/82, 66, 74

[56] References Cited
U.S. PATENT DOCUMENTS

| | | | |
|---|---|---|---|
| 2,734,154 | 2/1956 | Pankove | 357/66 |
| 3,475,660 | 10/1969 | Coblenz | 357/66 |
| 3,812,404 | 5/1974 | Barkan et al. | 357/82 |

Primary Examiner—Edward J. Wojciechowicz

[57] ABSTRACT

A high-power semiconductive device having a conductive liquid for maintaining contact between the active semiconductive element and the associated current supply and feeding facilities is described. A resilient insulating ring disposed in contact with the periphery of the active semiconductive element is contacted on respectively opposite sides by a pair of heat-conductive tubes that serve as the current supply elements of the device. A pair of conductive plates disposed on opposite sides of the semiconductive element are secured to the sides of the heat-conductive tubes to close off a pair of mutually insulated chambers which are bounded on the other side by the terminal areas of the semiconductive element. The conductive liquid is disposed in each of the so-defined chambers to provide thermal and electrical contact between the heat-conductive tubes and the terminal areas of the semiconductive element.

4 Claims, 1 Drawing Figure

U.S. Patent  July 19, 1977  4,037,246
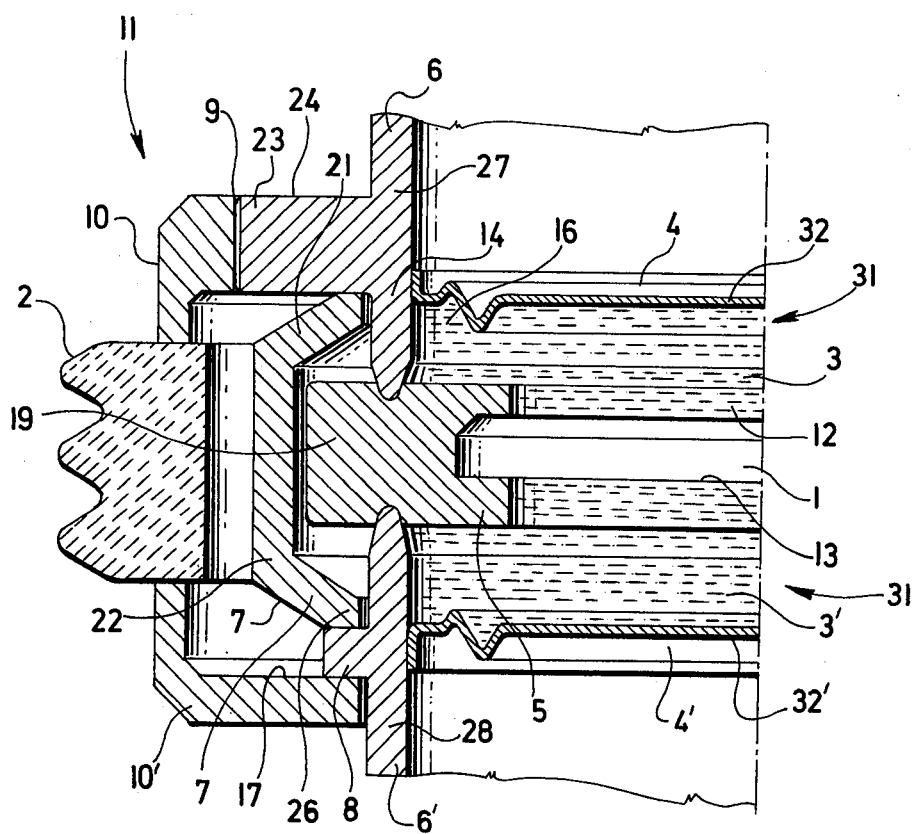

HIGH-POWER SEMICONDUCTIVE DEVICES

BACKGROUND OF THE INVENTION

The invention relates to high-power semiconductive devices in which a conductive liquid is disposed between the opposed terminal regions of the active semiconductive element and the current supply and receiving terminals of the device.

In a typical known device of this type, the active semiconductive portion is cooled by forced recirculation of the conductive liquid within the device. Unfortunately, in addition to being relatively complicated and expensive, such design requires the use of a relatively large amount of the conductive liquid. Additionally, the technique of employing forced recirculation of the liquid conductor is less efficient than that of directly conductively contacting the terminal regions of the semiconductive element with separate heat-conductive tubes. Such latter construction, in turn, has also been found disadvantageous in the prior art, irrespective of whether the conductive contact is established by pressure or by heating (e.g. soldering or brazing). For example, the use of pressure to engage the heat-conductive tube and the semi conductive element has led to problems because of their different coefficients of thermal expansion, while the use of soldering or brazing has been found to set up stresses which cause fractures of the brittle silicon plate.

SUMMARY OF THE INVENTION

All of the above disadvantages are overcome with the design of high-power semiconductive devices of the liquidconductor type in accordance with the present invention.

In an illustrative embodiment, an insulating ring is disposed around and in contact with the outer periphery of the semiconductive element. The job of carrying heat away from the semiconductive element is taken up by a pair of heat-conductive tubes that also supply current to and remove current from the semiconductive element. A pair of relatively thin-walled projections on the conductive tubes are disposed in contact with the insulating ring around the semiconductive element, which is preferably made of elastomeric material to accommodate differences in the thermal expansion of the tubes and the element.

The required electrical and thermal conductivity between the heat-conductive tubes and the semiconductive element is provided by the conductive liquid, which is introduced into two spaced, closed chambers which are defined on each side of the semiconductive element by (1) a tube projection, (2) the terminal region of the semiconductive element and (3) a separate thin conductive plate disposed in spaced relation to such terminal region and in contact with the interior wall of the projection.

With such arrangement, the required thermal and electrical contact between the heat-conductive tubes and the semiconductive element is accomplished by a relatively low-pressure direct static contact of the liquid conductor, without the necessity of forced recirculation of the liquid. Additionally, the advantages of solid conductive tubes for carrying away the heat generated by the active semiconductive element is accomplished without the generation of stresses and differential thermal expansions of the tube and element, as in the prior art.

BRIEF DESCRIPTION OF THE DRAWING

The invention is further set forth in the following detailed description taken in conjunction with the appended drawing, in which the single figure is an elevation view in section of a cylindrical embodiment of high-power semiconductive device constructed in accordance with the invention.

DETAILED DESCRIPTION

Referring now to the drawing, a high-power semiconductive device represented generally at 11 includes a generally cylindrical active semiconductive element 1, illustratively of silicon, which is provided with one or more P-N junctions (not shown). As is well-known, depending on the number of P-N junctions and the internal arrangements of the doped silicon components, the element 1 may be a diode, transistor, triac, thyristor, or the like; the exact type and configuration of such element 1 forms no portion of the invention. For simplicity, it will be assumed that the element 1 is a diode the opposite sides of whose single P-N junction are brought out to opposed terminal regions 12, 13, which are to be connected to a suitable current supply as described below.

An insulating ring 5 is secured as shown to the outer periphery of the active element 1. The ring 5 is preferably made from rubber or other elastomeric material.

Disposed radially outward of the resilient ring 5 is an insulating element 2, illustratively of ceramic, which carries a pair of oppositely projecting extensions 10, 10'. The extension 10 is generally L-shaped in cross-section and terminates on its outer periphery in an internal thread 9. The thread 9 matingly engages with an external thread on the outer periphery of a heat-conductive tube 6 which is coaxial with the active semiconductive element 1.

The tube 6 terminates at its forward end in a relatively thin-walled projection 14, which firmly engages one surface 16 of the resilient ring 5 when the sleeve 6 is threaded into the extension 10.

In like manner, a second heat-conductive tube 6' is engaged by the outer surface of the extension 10' to form a seal therebetween. For this purpose, the tube 6' is provided with an externally projecting shoulder 8, whose lower surface is pressed into engagement with an upper surface 17 of the projection 10'.

The tube 6', like the tube 6, is provided with a relatively thin-walled forward projection 18 which is embedded into a surface 19 of the resilient ring 5 opposite the surface 16.

In order to establish a correct predetermined spacing between the opposed heat-conductive tubes 6, 6', an insulating spacer 7 of generally cylindrical shape is disposed intermediate the resilient ring 5 and the ceramic sleeve 2. The spacer 7 is provided with a pair of opposed diverging arms 21, 22. The upper arm 21 contacts a lower surface 23 of an externally projecting collar 24 on the tube 6, while the lower arm 22 contacts an upper surface 26 on the collar 8 of the tube 6'. Disposed above and in spaced relation to the terminal region 12 of the active element 1 is a thin conductive plate 4 which is secured on its outer periphery to an internal wall 27 of the tube 6. In like manner, a thin-walled plate 4' is disposed below and in spaced relation to the terminal region 13 of the element 1, and has its outer periphery secured to a wall 28 of the tube 6'. This construction results in the formation of a pair of spaced, mutually insulated chambers 3, 3'. The upper chamber 3 is bounded by the plate 4, the projection 14, the surface 16 of the ring 5, and the terminal region 12 of the element 1. The lower chamber 3' is bounded by the plate 4', the projection 18, the lower surface 19 of the resilient ring 9, and the terminal region 13 of the element 1.

Each of the chambers 3, 3' are filled with a liquid 31 of high electrical and thermal conductivity. One suitable liquid, which has a desirable small mass as well as the properties indicated above, may be a eutectic alloy of sodium and potassium; such a composition is in liquid form throughout the range $-12°-1000°$ C, and its lower limit can be diminished still further by adding a quantity of cesium thereto.

In order to fill the chambers 3, 3' with the liquid 31 to obtain the required static thermal and electrical connection between each of the terminal regions of the element 1 and the associated tube projections, each of the boundary plates 4, 4' may be provided with sealable filling holes 32, 32'.

The above-described embodiment is advantageous in several respects. Firstly, the active element 1 may be efficiently cooled and supplied with current. Additionally, since each of the elements 1 and 6, 6' are separately in contact with the resilient ring 5, any differences therebetween in thermal expansion is easily accommodated without injuring the performance of the device.

In the foregoing, one embodiment of the invention has been described. Many variations and modifications will now occur to those skilled in the art. It is accordingly desired that the scope of the appended claims not be limited to the specific disclosure herein contained.

What is claimed is:

1. In a high-power semiconductive device including an active semiconductive element symmetrically disposed about a first axis, the elements containing at least one P-N junction and including at least first and second axially spaced, opposed terminal regions associated with such junction, mutually insulated means for supplying current to and receiving current from the first and second terminal regions, and means including a conductive liquid for providing conductive contact between the current supplying and receiving means and the respective terminal regions of the element, the improvement wherein the device further comprises an annular insulation ring coaxial with and surrounding the element, the radially inner surface of the insulating ring being disposed in intimate contact with the outer periphery of the element intermediate the axially opposite surfaces of the ring; wherein the current supplying and receiving means comprises first and second conductive tubes coaxial with and disposed on axially opposite sides of the element, the boundary walls of the first and second tubes being aligned with the opposed axial surfaces of the insulating ring, the inner ends of the first and second tubes being of reduced width and disposed in intimate contact with the axially opposite surfaces of the insulating ring; and wherein the device further comprises a pair of thin conductive plates extending across and substantially closing the interior of the respective first and second tubes in spaced relation to the ends of the tubes to individually define, with the associated ends of the tubes and the opposed terminal regions of the elements, first and second mutually insulated closed chambers, the conductive liquid filling each of the closed chambers.

2. A device as defined in claim 1, further comprising an insulating sleeve surrounding and in spaced relation to the insulating ring, a pair of extensions projecting from opposite sides of the insulating sleeve, and means for individually attaching the first and second tubes to the respective extensions.

3. A device as defined in claim 2, in which at least first the first tube has an external thread on its outer periphery, and in which the means for attaching the first tube to the associated extension comprises an internal thread engageable with the external thread on the first tube.

4. A device as defined in claim 1, further comprising an insulating spacer element disposed intermediate the insulating sleeve and the insulating ring, the spacer element being disposed in engagement with the first and second tubes for establishing a fixed spacing therebetween.

* * * * *